US005916424A

United States Patent [19]

Libby et al.

[11] Patent Number: 5,916,424

[45] Date of Patent: Jun. 29, 1999

[54] THIN FILM MAGNETIC RECORDING HEADS AND SYSTEMS AND METHODS FOR MANUFACTURING THE SAME

[75] Inventors: Charles J. Libby, Winchester; Donald E. Yansen, Lexington; Gregory J. Athas, Newton; Raymond Hill, Rowley; Russell Mello, Stoneham, all of Mass.

[73] Assignee: Micrion Corporation, Peabody, Mass.

[21] Appl. No.: 08/635,063

[22] Filed: Apr. 19, 1996

[51] Int. Cl.$^{6}$ .............................. C23C 14/54; C23F 1/02; G21K 5/10

[52] U.S. Cl. ............................... 204/298.36; 204/298.32; 156/345; 250/492.1; 250/492.21; 250/492.22; 250/492.3

[58] Field of Search ......................... 204/298.31, 298.32, 204/298.36; 156/345; 250/396 R, 397, 423 R, 427, 492.1, 492.2, 492.21, 492.22, 492.3

[56] References Cited

U.S. PATENT DOCUMENTS

| | | | |
|---|---|---|---|
| 4,078,300 | 3/1978 | Lazzari | 29/603 |
| 4,457,803 | 7/1984 | Takigawa | 204/298.36 |
| 4,639,301 | 1/1987 | Doherty et al. | 204/298.32 |
| 4,683,378 | 7/1987 | Shimase et al. | 250/492.2 |
| 4,939,364 | 7/1990 | Ishitani et al. | 250/309 |
| 5,149,976 | 9/1992 | Sipma | 250/396 R |
| 5,157,570 | 10/1992 | Shukovsky et al. | 360/126 |
| 5,314,596 | 5/1994 | Shukovsky et al. | 204/192.2 |
| 5,404,635 | 4/1995 | Das | 29/603 |
| 5,452,166 | 9/1995 | Aylwin et al. | 360/126 |
| 5,574,280 | 11/1996 | Fujii et al. | 250/492.21 |
| 5,616,921 | 4/1997 | Talbot et al. | 250/492.21 |
| 5,630,949 | 5/1997 | Lakin | 204/298.31 |

FOREIGN PATENT DOCUMENTS

| | | |
|---|---|---|
| 0 452 846 A2 | 10/1991 | European Pat. Off. . |
| 0 479 252 A1 | 4/1992 | European Pat. Off. . |
| 0 517 137 A2 | 12/1992 | European Pat. Off. . |
| 61175914 | 8/1986 | Japan . |
| 61237216 | 10/1986 | Japan . |
| 05101352 | 4/1993 | Japan . |
| 05298612 | 11/1993 | Japan . |
| 06103512 | 4/1994 | Japan . |
| 06243430 | 9/1994 | Japan . |
| WO 89/12294 | 12/1989 | WIPO . |

*Primary Examiner*—Nam Nguyen
*Assistant Examiner*—Rodney G. McDonald
*Attorney, Agent, or Firm*—Lahive & Cockfield, LLP

[57] ABSTRACT

Thin-film magnetic recording heads and systems and processes for manufacturing the same are disclosed. In one embodiment, the invention is understood as a focused particle beam system that includes a pattern recognition element and that employs the pattern recognition element to image and analyze the pole-tip assembly footprint of a recording head and that employs a processor to generate instruction signals that direct a focused particle beam to remove selected portions of the recording head and thereby shape the pole-tip assembly of the recording head. The focused particle beam system provides a precision milling device that can employ the coordinate information to mill selectively the recording head and thereby shape the geometry of the pole-tip assembly footprint, including geometries that have contoured surfaces.

22 Claims, 8 Drawing Sheets

THIN FILM MAGNETIC RECORDING HEADS AND SYSTEMS AND METHODS FOR MANUFACTURING THE SAME

FIELD OF THE INVENTION

The invention relates to thin-film magnetic heads for reading and writing data onto magnetic media, and more particularly to thin-film magnetic heads having contoured surfaces and to systems and processes for manufacturing the same.

BACKGROUND OF THE INVENTION

Thin-film magnetic recording heads have gained wide acceptance in the data storage industry. Due to their small size, thin-film magnetic heads form narrow tracks of data on to the magnetic media of magnetic memory devices, such as computer hard disks, and digital data tape drives. These narrow data tracks allow the device to store more data tracks per area of media and therefore more data per device. Accordingly, reducing the size of the recording head results in an increase in the total data storage capacity of a magnetic memory device.

Typically, a thin-film magnetic head is formed from a substrate that includes a pole-tip assembly that comprises two conductive layers, called poles, separated at one end by an insulating layer and conductively connected at the opposite end to form a single magnetic device capable of generating and detecting magnetic fields. The size of the pole-tip assembly, which includes features on the order of one-half a micron, in part determines the magnetic field pattern produced by the pole-tip assembly. This magnetic field pattern effects how narrowly the recording head can record data tracks. Accordingly, manufacturers seek to form the geometry of the pole-tip assembly as precisely as possible to thereby achieve pole-tip assemblies capable of providing magnetic field patterns suitable for reading and writing narrow tracks of recorded data.

Manufacturers presently attempt to form the precise footprint of the pole-tip assembly by employing lithographic techniques to fabricate the read/write heads. Typically, the lithographic technique deposits alternating layers of conductive and insulating materials onto the substrate by means of an evaporation, sputtering, plating, or other deposition technique that provides precise control of the deposition thicknesses. In a subsequent step, the technique employs chemical etching, reactive ion etching (RIE), or other means to shape and form the deposited layers into a pole-tip assembly having the desired geometry.

Although the existing lithographic techniques work sufficiently well to provide pole-tip assemblies having feature sizes suitable for today's data storage capacity, these lithographic techniques are quickly reaching their limit as to the feature sizes that can be produced. For example, the present photolithographic techniques require precise application of photoresist layers to the surface of the pole assembly. Commonly, the photoresist layer is applied with a topology that includes voids having 10:1 aspect ratios. Such photoresist topologies are difficult to achieve reliably and consequently, manufacturing defects are common.

Moreover, these lithographic techniques are poorly suited for large scale manufacturing. Specifically, lithographic etching of pole-tip assemblies is time consuming and material intensive. Further, the purpose of the lithographic etching of pole-tip assemblies is to correct manufacturing defects that occurred during the manufacture of the pole-tip assembly. However, the defective geometries that occur during the manufacturing process are difficult to predict and prone to wide variations. Accordingly, the application of a universal photoresist pattern to the surface of a pole-tip assembly is a generalized solution that often is ill suited to the actual manufacturing defect of a subject read/write head. Therefore, current techniques for producing a magnetic recording head have several serious limitations with respect to their ability to control the physical geometry of the recording head. Consequently, current techniques are unacceptable for purposes of accurately shaping the recording heads for use in the higher density data storage devices desired by today's computer users.

Accordingly, it is an object of the present invention to provide improved manufacturing processes for manufacturing thin-film magnetic read/write heads, and more particularly, for precisely forming the pole-tip assembly of a magnetic read/write head.

It is a further object of the present invention to provide processes for manufacturing read/write heads that reduce the quantity of chemicals employed during the manufacturing processes.

It is a further object of the present invention to provide manufacturing processes more facile at adapting the geometry of a pole-tip assembly.

It is yet another object of the present invention to provide magnetic thin-film heads with pole-tip assemblies that include contoured surfaces.

It is still another object of the present invention to provide processes for manufacturing read/write heads that provide improved quality control.

The invention will next be described in connection with certain embodiments; however, it will be clear to those skilled in the art of semiconductor device fabrication that various modifications, additions and subtractions can be made to the below-described embodiments without departing from the spirit or scope of the invention.

SUMMARY OF THE INVENTION

It is a realization of the present invention that a focused particle beam can be employed to mill a recording head pole-tip assembly by employing pattern recognition to determine precisely the coordinates of the pole-tip assembly and for determining portions of the pole-tip assembly that are to be removed to achieve the desired pole-tip geometry. A focused particle beam can include an ion beam, electron beam, x-ray beam, optical beam or any other source of directable radiant energy.

The invention provides thin-film magnetic recording heads and systems and processes for manufacturing the same. In one embodiment, the invention is understood as a focused particle beam system that includes a pattern recognition element and that employs the pattern recognition element to image and analyze the pole-tip assembly footprint of a recording head and that employs a processor to generate instruction signals that direct a focused ion beam to remove selected portions of the recording head and thereby shape the pole-tip assembly of the recording head. It is a realization of the invention that a pattern recognition system can analyze an image of a pole-tip assembly to generate coordinate information that describes the precise geometry of the pole-tip assembly footprint. The focused ion beam provides a precision milling device that can employ the coordinate information to mill selectively the recording head and thereby shape the geometry of the pole-tip assembly footprint. It is a further realization of the present invention that a pattern recognition system is well suited to the analysis of the pole-tip assembly footprint geometry and can provide the processor with coordinate information suitable for determining from that geometry a most efficient or economical milling pattern for shaping a pole-tip assembly.

It is a further realization of the invention that a focused particle beam, such as a focused ion beam, can provide precise and variable control of the milling depth achieved during the removal process to thereby provide thin-film magnetic read/write heads that have contoured surfaces. A contoured surface, as the term is used herein, encompasses any surface feature of the read/write head, which includes the pole-tip assembly, that includes a continuously sloping portion, such as a curving portion, or a linearly sloping portion. Additionally, the invention facilitates the formation of recording heads that include stepped surfaces and provides systems and processes for forming such stepped surfaces. A stepped surface, as the term is used herein, is understood to encompass any surface, or portion of a surface, that includes plural elevated faces. These contoured and stepped surfaces are understood to effect the magnetic fields generated by the pole-tip assembly. Accordingly, it will be understood that the invention provides thin-film magnetic heads, and systems and processes for manufacturing the same, that have contoured surfaces adapted for generating magnetic field patterns having select characteristics such as field pattern, field strength, or other characteristic.

In one embodiment, the invention includes apparatus that shape with a focused particle beam a pole-tip assembly of a recording head, and that include a platform for receiving the recording head having the pole-tip assembly and for disposing the recording head for contact with the focused particle beam, an element for generating an image signal of the recording head pole-tip assembly and for generating, responsive to the image signal, a coordinate signal representative of a position of the recording head pole-tip assembly relative to the focused particle beam, and a processor element responsive to the coordinate signal for generating a milling signal representative of an instruction for applying the focused particle beam to a selected portion of the recording head for shaping the pole-tip assembly by milling the selected portion of the recording head.

The element for generating an image signal can include a source of a focused particle beam, such as a focused ion beam, that can be scanned across the surface of the recording head for generating an image signal. Alternatively, the image generating elements can include a camera element, such as a CCD camera that generates optical images of the recording head. Preferably, the system of the invention includes a charge neutralization element for neutralizing a static charge on the recording head, which typically builds up on the recording head surface during exposure to the ion beam. One such charge neutralization element can include an electron gun element for providing a beam of electrons directed toward the recording head.

It is understood that the beam of electrons neutralizes static charge buildup on the surface of the recording head to provide several advantages including more precise collection of images by an imaging element that employs a focused ion beam, or other charged particle beam, for generating the image signal, and for preventing a static charge buildup on the recording head that would defocus, destabilize, or blur the focused ion beam during the milling process. Accordingly, the charge neutralization element can allow more precise imaging of the recording head to provide more precise images of the pole-tip assembly geometry and thereby allow the generation of more precise coordinate information as to the geometry of the pole-tip assembly. Further, the charge neutralization element reduces accumulated charge build up on the recording head surface and thereby reduces defocusing of the ion beam during the milling process to achieve more precise particle beam milling operations and more precisely shaped pole-tip assemblies.

In a further embodiment of the invention, the element for generating an image signal includes an edge detection element for generating an edge signal that represents a location of an edge of the pole-tip assembly. Further, the element for generating an image signal can include a feature extraction element for determining a geometric pattern signal that represents an outline of a portion of the pole-tip assembly. Further, the element for generating an image signal can include an element for generating the coordinate signal as a function of this geometric pattern signal.

The processor element can include a trim-outline element for generating as a function of the coordinate signal a geometric pattern representative of the selected portion of the recording head to be milled. Further, the trim-outline element can include an adaptor element for generating the trim-outline signal as a function of a process time for milling the recording head or as a function of an area of the selected portion of the recording head to be milled.

In a further embodiment of the invention the means for generating an image signal can include a control means that generates an image signal of the milled recording head and generates a mill-successful signal as a function of this image to represent the completion of a successful milling process for shaping the pole-tip assembly.

In a further embodiment of the invention, the platform includes a delivery tray element for disposing plural recording heads for contact with the focused particle beam.

In a further embodiment of the invention, the system can include a processor element that has a multidimensional milling element for generating milling signals for contouring a surface of the recording head. The multidimensional milling element can include a dose control element for controlling the energy delivered by the particle beam to a portion of the recording head. In one embodiment, the dose control element includes a scan generator board that has a dwell control element for generating a dwell time signal representative of a measure of time for the focused particle beam to be directed to the recording head. In one embodiment, the dose control element includes a pixel dose control element for generating as a function of the coordinate signal a pixel signal representative of a measure of time for directing the focused particle beam to a discrete location of the recording head.

In a preferred embodiment of the invention, the system includes a source of a focused particle beam that has a focusing element for generating a focused particle beam that has a reduced beam tail. Typically, the focused particle beam includes an ion beam source for generating a focused ion beam and the ion beam source includes a first lens coupled to an electrical source for negatively biasing the first lens. In this embodiment the focused particle beam source generates a focused particle beam having a reduced beam tail current. The ion beam source can include a liquid metal ion source or a gas field ion source element.

In a further aspect the invention provides thin-film magnetic recording heads that include a positive pole and a negative pole for providing a magnetic field and wherein one of the poles has a continuously sloped surface for providing the magnetic field with a selected field characteristic. In one embodiment, the thin-film magnetic recording head has a continuously sloped surface that forms a trough between a first surface of the recording head and a second surface of the recording head.

Accordingly, the invention provides processes for employing a focused particle beam to shape a pole-tip assembly of a recording head and comprises the steps of disposing the recording head on a platform for contact with the particle beam, generating an image signal of the recording head, generating responsive to the image signal a coordinate signal representative of a position of the recording head pole-tip assembly relative to the focused particle beam, and generating milling signals representative of an instruction for applying the focused particle beam to a selected portion of the recording head for shaping the pole-tip assembly by milling the selected portion of the recording head. Preferably, the process includes the first step of providing a charge neutralization element for neutralizing a static electric charge that can occur on the recording head.

In one embodiment, the step of generating a coordinate signal includes the step of detecting an edge of the recording head and generating an edge signal representative of a location of the edge of said recording head relative to the focused particle beam. Further the process can include a step for generating milling signals that also includes the step of generating, as a function of the image signal, a presentation signal representative of a pattern presentation of the recording head. Further the step of generating milling signals can include the step of comparing the presentation signal to a pattern signal representative of a select recording head topography. The step of comparing the presentation signal to the pattern signal can include the step of determining an etching pattern signal representative of one or more areas to etch from the recording head to conform the recording head substantially to the select recording head topography.

In a further embodiment, the process can be adaptable for achieving the etching process as efficiently as possible. In one embodiment, the step of determining an etching pattern signal includes the step of determining a minimum etching time signal that represents a milling pattern having a minimum length of time for conforming the recording head substantially to the select recording head topography. Similarly, the step of determining an etching pattern signal can include the step of determining a minimum etching area signal that is representative of a milling pattern having a minimum area to be removed for conforming the recording head substantially to the select recording head topography. In this embodiment, the process preferably includes a further step of generating milling signals by comparing the presentation signal to plural ones of the pattern signals and for selecting one of the pattern signals as a function of the comparison.

Accordingly, a process of the invention can generate an image of the presentation of the pole-tip assembly and analyze that image by comparing the presentation of the pole-tip assembly to a number of known pattern signals and for selecting a substantially optimum pattern signal for etching the pole-tip assembly. Further, the process can include a step of comparing the presentation of the imaged pole-tip assembly to plural ones of stored modeled presentation signals, each of which represents a possible presentation of a pole-tip assembly, and for determining which of the modeled presentation signals most resembles the imaged presentation signal and to determine from this comparison a pattern signal for milling the pole-tip assembly.

In one embodiment, the process generates instruction signals that are representative of locations for deflecting the particle beam. Alternatively, the process can include a step of generating an instruction signal which is representative of locations for moving the platform. Alternative methods for applying the focused ion beam to the recording head can be practiced with the present invention without departing from the scope thereof.

In a preferred embodiment of the invention, the process includes a step of generating milling signals that control the focused particle beam to etch in three dimensions. Preferably the step of controlling the focused particle beam includes the step of controlling the energy delivered by the focused particle beam to a portion of the recording head and can include the step of controlling a dwell time that is representative of a measure of time for the focused particle beam to be directed to a location on the recording head. The process can include a further step of generating, for each discrete position or pixel being milled, a dose for that particular discrete portion. Alternatively the process can include a step of determining a number of times to scan across a selected portion of the recording head for controlling the delivered dose, to thereby control the depth of milling the recording head.

In a further aspect, the invention is understood as a thin-film recording head formed by a milling process that comprises the steps of providing a source of a focused particle beam, disposing the recording head on a platform and locating the recording head for contact with the focused particle beam, generating an image signal of the recording head, generating, responsive to the image signal, a coordinate signal representative of a position of the recording head relative to the focused particle beam, and generating milling signals representative of an instruction for applying the focused particle beam to the recording head for etching in three dimensions the recording head to thereby mill contoured surfaces on said recording head. Thin-film recording heads according to this aspect of the invention can have contoured surfaces that extend between an upper surface of the recording head and a lower surface of the recording head.

The foregoing summary, as well as the following detailed description of the exemplary embodiments of the invention, will be better understood when read in conjunction with the appended figures. For purposes of illustrating the invention, the provided figures depict the embodiments that are presently preferred. It is to be understood that the invention is not to be limited to the precise arrangements and instrumentalities shown.

BRIEF DESCRIPTION OF THE ILLUSTRATED EMBODIMENTS

DETAILED DESCRIPTION OF THE ILLUSTRATED EMBODIMENTS

The invention provides improved thin-film magnetic heads and systems and methods for employing focused particle beams to manufacture the precise geometry of a pole-tip assembly to provide the improved thin-film magnetic heads of the invention. The invention is understood from the following detailed description of certain exemplary embodiments.

Figure 1:
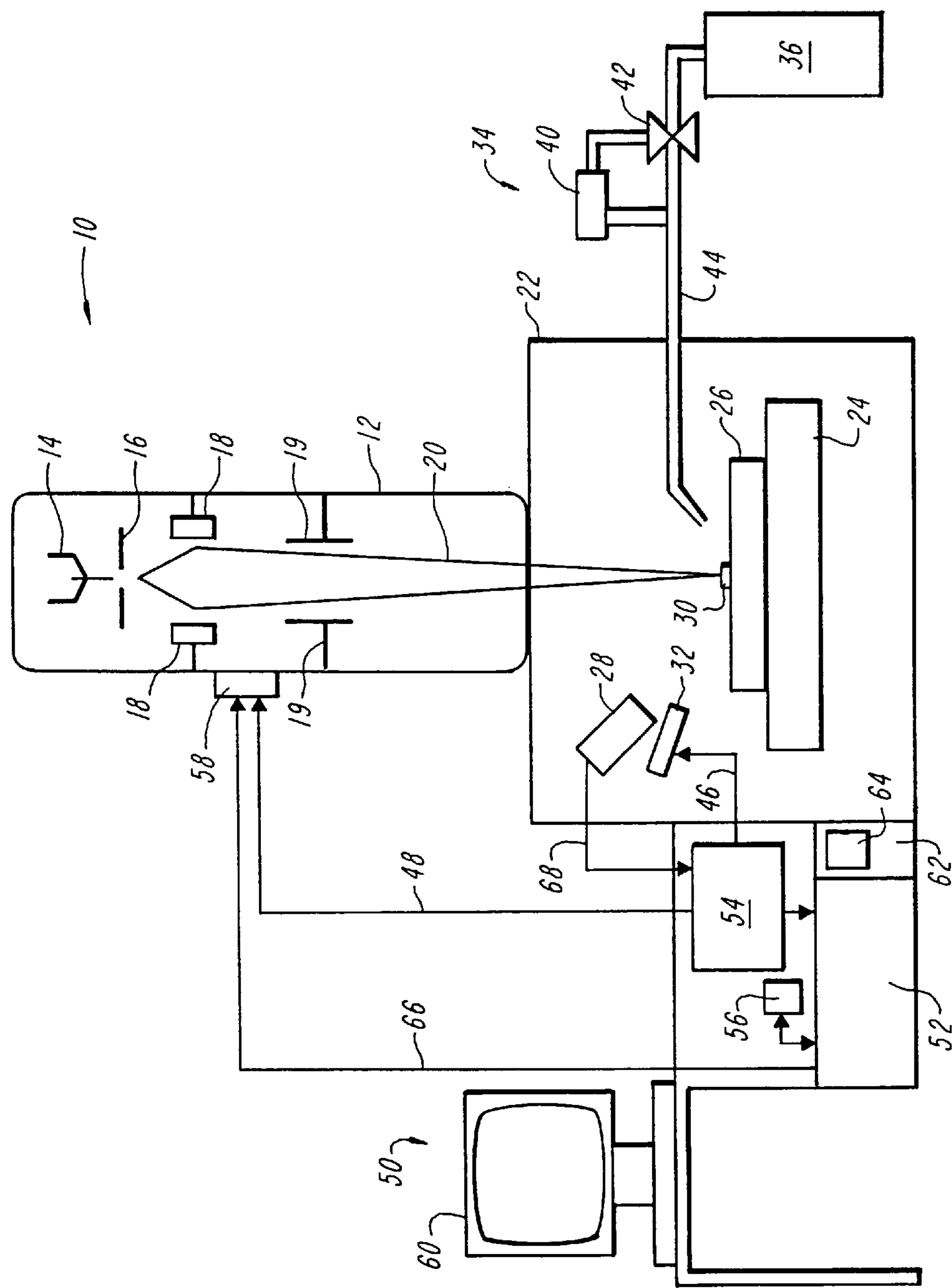
FIG. 1 depicts one system according to the invention for manufacturing thin-film magnetic recording heads.

FIG. 1 depicts one focused particle beam system 10 according to the invention for manufacturing thin-film magnetic heads. The system 10 of FIG. 1 includes an ion column 12, a vacuum chamber 22, an optional reactant material delivery system 34 and user control station 50. The system 10 provides a focused particle beam system that can precisely mill thin film recording heads, including thin film recording heads having contoured surfaces. These recording heads are seated within the vacuum chamber 22 and operated on by a particle beam generated by the column 12 to mill the pole-tip assembly of the recording head. For clarity, FIG. 2 depicts an example of a recording head that can be seated within chamber 22 and processed by the system 10.

Figure 2:
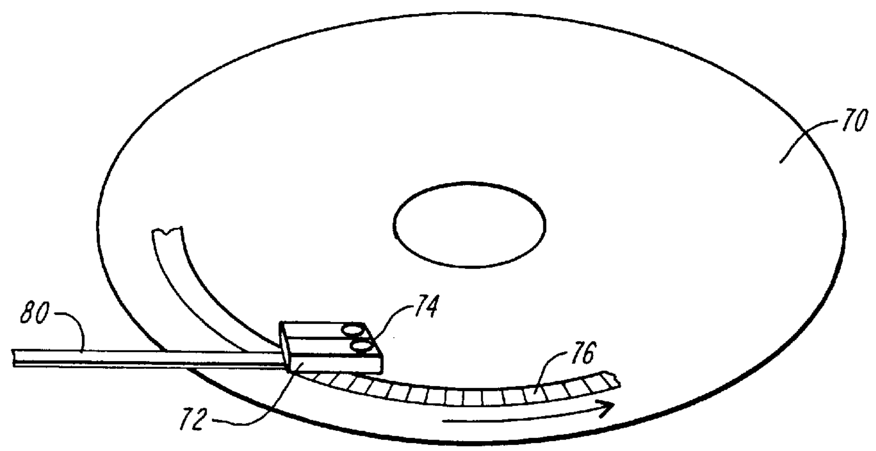
FIG. 2 depicts one thin-film magnetic recording head according to the invention disposed above a data track of a magnetic medium.

FIG. 2 illustrates an example of one type of thin film recording head manufactured by system 10. FIG. 2 depicts a hard disk 70, the thin film magnetic read/write head 72, a pole-tip assembly 74, a data track 76, and an extension arm 80. As depicted by FIG. 2, the read write recording head 72 is disposed at the distal end of the arm 80 and sits just above the rotating disk 70. The read/write head records and reads digital data by generating or depicting magnetic pulses that form the data track 76.

Figure 3:
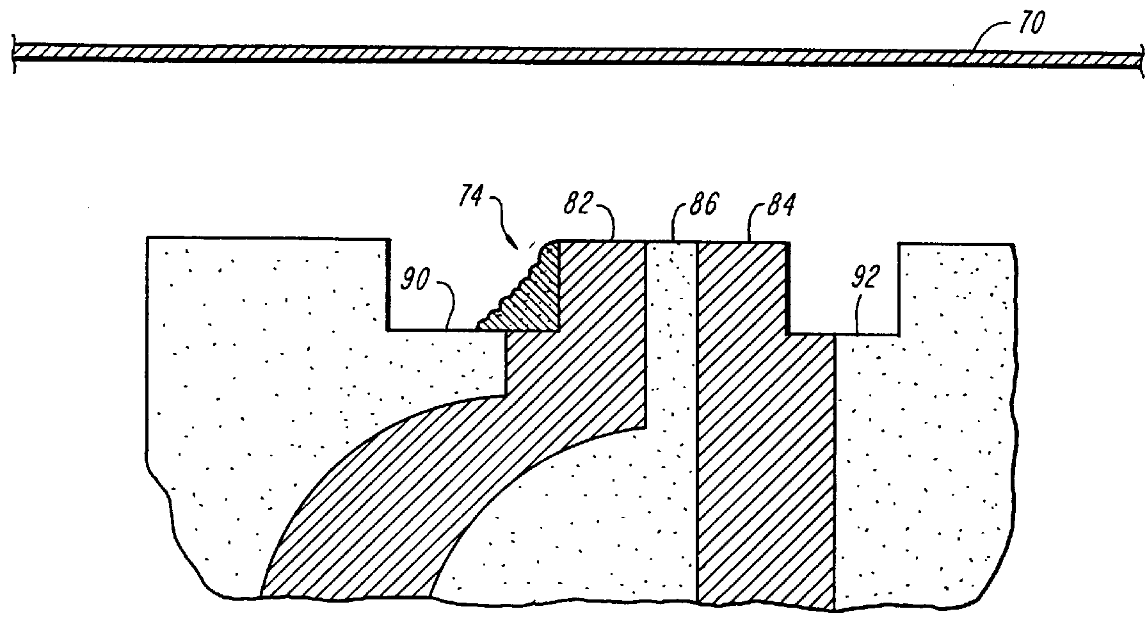
FIG. 3 depicts in more detail the pole-tip assembly of the recording head depicted in FIG. 2.

FIG. 3 depicts in greater detail the pole-tip assembly of the read write head 72 depicted in FIG. 2. FIG. 3 depicts the pole-tip assembly 74, a first pole 82, a second pole 84, a pole gap 86, a recess surface 90, a recess surface 92 and the disk 70.

The cross-sectional view provided by FIG. 3 illustrates that the poles 82 and 84 of the read/write head 74 extend into the substrate of the read write head 74. FIG. 3 further depicts that the poles 82 and 84 are separated by the gap 86 that provides a separation between the poles. As is known in the art of thin film magnetic heads, the separation 86 between the two poles 82 and 84 causes a magnetic field pattern to form between the two poles and above the gap 86. In this way the pole-tip assembly 74 generates a magnetic field pattern that can induce a magnetic response within the magnetic media of disk 70, that results in an area of magnetism forming on the disk 70. In this way the read/write head 74 can write digital data into the track 76. Similarly, a magnetic spot on a disk 70 forms a magnetic field as it passes proximate to the pole-tip assembly 82 and 84. The magnetic field generated by the spot on disk 70 causes a magnetic response by the pole-tip assembly and can be detected by the magnetic read/write head 74. In this way the recording head 72 can be employed to read magnetic data written on the disk 70.

With reference again to the illustrated embodiment of FIG. 1, the ion column 12 includes an ion source 14, an extraction electrode 16, a focusing element 18, deflection elements 19, and a focused ion beam 20. The ion column 12 sits above the vacuum chamber 22, and the vacuum chamber 22 houses a stage 24, a platform 26, a read/write head 30, a secondary particle detector 28 and a charge neutralization element 32. As further depicted by FIG. 1, the optional reactant material delivery system 34 includes a reservoir 36, a manometer 40, a motorized valve element 42, and delivery conduit 44. The user control station 50 includes the processor 52, a pattern recognition element 54, the memory element 56, a display element 60, a scan generator element 62, and dwell registers 64.

It will be apparent to one of ordinary skill in the art, that the system 10 depicted in FIG. 1 includes a conventional focused ion beam (FIB) system with an ion column 12 disposed above a vacuum chamber 22 that includes an optional reactant material delivery system 34 for providing reactant materials to the interior of chamber 22. As will be understood by one of ordinary skill in the art, the depicted ion column 12 is a schematic representation of one ion column suitable for practice with the invention. The depicted ion column 12 includes an ion source 14 that can be a liquid metal ion source (LMIS) such as a gallium ion source, or can be a gas field ion source (GFIS) such as a helium ion source. The ion source 14 sits above the extraction electrode 16. The extraction electrode 16 generates sufficient electric field to draw an ion stream from the ion source 14. The ion stream travels past focusing element 18, that can be conventional electro-optical lenses that focus the ion stream to the finely-focused beam 20. As further depicted, the ion column 12 includes the deflection elements 19 that can deflect the ion beam 20 to scan across the surface of the read/write recording head 30.

Similarly, the evacuation chamber 22 can be a conventional evacuation chamber that includes a stage element 24 for supporting a workpiece such as the delivery tray 26 that holds the workpiece recording head 30. Preferably the platform 24 is a movable work stage that provides three-dimensional control of the displacement of the workpiece being operated on by the system 10. Similarly, evacuation chamber 22 includes a charge neutralization element 32, such as an electron gun, and further includes a secondary particle detector 28 for detecting secondary particles, such as electrons, ions, or any other particles suitable for generating an image of the workpiece. Any vacuum chamber 22 as schematically depicted herein can be practiced with the present invention, including the vacuum chamber sold with the ion beam workstation sold by Micrion Corporation of Peabody, Mass.

Similarly, the optional reactant material delivery system 34 can be any conventional reactant material delivery system suitable for delivering reactant material such as precursor gases into the interior of the vacuum chamber 22, and more particularly into the chamber 22 and proximate to the surface of the workpiece. The reactant material delivery system 34 can deliver materials to the surface of the read/write head 74 to enhance the etching of material from the surface or alternatively, to deposit material on the surface of the head.

The depicted reactant material 34 includes a reservoir 36 that couples in fluid communication with the fluid delivery conduit 44 that has a distal portion formed as a nozzle for delivering reactant materials to the surface of the workpiece. The depicted reactant delivery system 34 includes a manometer 40 coupled to conduit 44 for measuring the delivery pressure within conduit 44 of any reactant materials being delivered to the surface of the workpiece 30. Manometer 40 further couples to the motorized valve element 42. The motorized valve element 44 is selectively controllable for increasing or reducing the flow of reactant materials of reservoir 36 through fluid delivery conduit 44. The arrangement of the manometer 40 and motorized valve 42 depicted in FIG. 1 forms a feedback control system wherein the manometer 40 measures the delivery pressure within conduit 44 and selectively controls the motorized valve 42 to increase or decrease the flow of reactant material to thereby maintain a select delivery pressure.

The operation of the ion column 12, charge neutralization element 32, and secondary particle detector 28 are controlled by the control station 50. The depicted control station 50 includes a processor element 52 that has a scan generator element 62 that includes dwell register 64. The processor element 52 couples via a transmission path to a control element 58 coupled to the ion beam column 12. The depicted processor element 52 can be a conventional computer processor element that includes a CPU element, a program memory, a data memory, and an input/output device. One suitable processor element 52 is a Sun Workstation operating a Unix operting system.

As further depicted by FIG. 1, the processor element 52 can connect, via the input/output device to a scan generator element 62. In one embodiment, the scan generator element is a circuit card assembly that connects to the processor 52 via the processor input/output device. The circuit card assembly scan generator element 62 depicted in FIG. 1 includes a scan memory for storing data representative of a scanning pattern that can be implemented by system 10 for scanning ion beam 20 across the surface of the workpiece 30 to selectively mill, or etch the surface of the workpiece 30.

The scan generator board element 62 depicted in FIG. 1 can be a conventional computer memory circuit card having sufficient memory for storing digital data information representative of locations of the recording head that are to be processed by the particle beam system 10. Typically, a scan generator board suitable for practice with the present invention includes a series of memory locations, each of which corresponds to a location on the recording head surface. Each memory location stores data representative of an X and Y location of the recording head and preferrably further has, for each X and Y location, a dwell register for storing digital data representative of a time for maintaining the particle beam on the surface of the recording head at the location represented by the associated X, Y pair. Accordingly, the dwell register provides a memory location for storing a dwell time for applying the focused particle beam to the surface of the recording head, to thereby allow control of the dose delivered to the recording head.

It will be apparent to one of ordinary skill in the art of focused particle beam processes and systems that the dose delivered to a location on a workpiece surface can be understood to determine generally the depth to which material is removed from that location of the workpiece. Accordingly, the dwell time signal stored in the dwell register can also be understood as representative of a depth, or Z dimension, for the particle beam milling process. Consequently, the processor 52 that couples to such a scan generator board 62 provides a multi-dimensional milling element for generating milling signals that can control in three dimensions the milling or etching process of the focused particle beam system.

Accordingly, the processor 52 employs the X, Y and Z data maintained by the scan generator board 62 to generate milling signals that are transmitted via the transmission path 66 to the control element 58 of the ion column 12.. In the depicted embodiment, the milling signals provide control element 58 with information for operating the deflector elements 19 to deflect the focused particle beam for scanning or rasterizing the focused particle beam across the surface of the recording head 30, and to maintain the particle beam at the selected location for a specified dwell time to provide milling to a selected depth. The surface of the recording head 30 generally corresponds to a two-dimensional plane that can be defined by an orthogonal pair of X and Y axes. A Z axis, that is generally understood as extending parallel to the path of the focused ion beam 20 is also generally orthogonal to the plane defined by the X and Y axis of the surface of the recording head 30. By controlling the location of the particle beam 20 and the period of time for which the beam 20 impacts against the surface of the recording head 30, material at selected locations of the recording head 30 can be removed. Accordingly, the system 10 provides multidimensional control of the milling process to thereby allow the particle beam 20 to remove selected portions of the recording head surface and form the precise geometric footprint of the recording head pole-tip assembly.

Although FIG. 1 depicts an ion column 12 that includes deflection elements 19 for deflecting an ion beam 20 to scan across the surface of the recording head 30 and thereby direct the focused ion beam to a selected location on the surface of the recording head 30, it will be apparent to one of ordinary skill in the art of focused particle beam processing that any system suitable for directing the focused particle beam to select locations of the recording head surface can be practiced with the invention. For example, in an alternative embodiment, the platform 24 can be moved in an X, Y or Z space which corresponds to the X, Y and Z space of the milling process and the milling signals generated by the processor 52 can be provided to a stage control system that moves the stage carrying the recording head 30 to thereby dispose a selected portion of the recording head directly in the path of the focused particle beam to mill the recording head 30. Other systems and methods for directing the particle beam can be practiced with the present invention without departing from the scope thereof.

It will be further be apparent to one of ordinary skill in the art of particle beam processes and systems that the depicted scan generator element 62 that is illustrated as a circuit card assembly of read/write computer memory can alternatively be implemented as software program code that runs on a computer platform having an accessible data memory that is configured by the program code to provide storage locations for storing the data representative of the X and Y locations as well as data representative of the dwell time. Such a modification is well within the art of one of ordinary skill and does not depart from the scope of the invention.

In this embodiment of the invention, the pattern recognition element 54 generates an image of the surface of the portion of the recording head 30 that includes the pole-tip assembly and processes the image to determine the precise position of the pole-tip assembly. The position of the pole-tip assembly can be represented by a coordinate signal that can define, in one embodiment, the coordinates of the periphery of the pole-tip assembly footprint relative to a predefined registration point. The use of predefined registration points, which act as landmarks, is known in the art of ion beam processing for manually positioning a workpiece during a preliminary step of a focused particle beam process. Other systems and methods for initializing the coordinate system employed by the pattern recognition system 54 can be practiced with the present invention without departing from the scope thereof.

The system 10 depicted in FIG. 1 includes a pattern recognition system 54 that connects via transmission path 48 to the depicted ion column 12, and further couples via transmission path 68 to the secondary particle detector 28 wherein transmission path 68 carries image data to the pattern recognition element 54, and further couples via transmission path 46 to the charge neutralization element 32 wherein transmission path 46 carries a control signal to the charge neutralization element 32 for activating and deactivating the charge neutralizer 32. In the depicted embodiment, the pattern recognition element 54 further connects via a bi-directional bus to the memory element 56 that acts as a computer memory element for storing data representative of known pole assembly footprint presentations.

In the embodiment depicted in FIG. 1, the pattern recognition system 54 employs the focused ion beam column 12 and the secondary particle detector 28 to generate an image of the surface of the recording head 30. Specifically, the pattern recognition element 54 generates a series of scanned control signals that are transmitted via transmission path 48 to the control element 58 of the ion column 12. The scanned control signals direct the control element 58 to scan the focused ion beam across the XY plane that defines the surface of the recording head 30 and particularly to scan the ion beam across the portion of the surface 30 that includes the pole-tip assembly. The scanning of the ion beam 20 across the recording head surface 30 causes the emission of secondary particles, including secondary electrons and secondary ions. The secondary particle detector 28 detects the omitted secondary particles and provides an image signal 68 to the pattern recognition system 54. The pattern recognition system 54 coordinates the image signal with the scanning signals that generate deflection signals that apply to the deflector elements 19 and correlates the image signal with the deflector signals so that changes in the detected signals are associated with particular deflection signals amplitudes corresponding to a particular location on the recording head surface 30. The detector 28's may be one of many types such as electron multiplier, micro channel plates, secondary ion mass analyzer, or photon detectors. Imaging techniques are described herein are well known in the art of focused ion beam processing and any substitutions, modifications, additions or subtraction's to the imaging technique can be described herein is deemed to be a scope of the invention. Preferably during the imaging process the pattern recognition element 54 generates a control signal transmitted via transmission path 46 to the charge neutralization element 32. The charge neutralization element 32 depicted in FIG. 1 is an electron gun element that directs a beam of electrons towards the surface of the recording head surface 30. The beam of electrons neutralizes a building static electric charge that arises on the recording head surface 30 during the imaging operation. By reducing the built-up electric static charge the charge neutralizer reduces the defocusing the ion beam and deflecting of the ion beam that results from the positive surface charge on the recording head 30 that defocuses and deflects the positively charged ion beam 20 scanning across the workpiece surface 30. Accordingly, the charge neutralizer element 32 allows the system 10 to generate more precise images of the recording head pole-tip assembly.

The pattern recognition element 54 stores the image signal representative of the image of the recording head and a computer memory that forms part of the pattern recognition element 54. The pattern recognition element 54 includes a pattern recognition processor such as one manufactured and sold by the Cognex Corporation of Needham, Mass. Further, the pattern recognition system 54 can supply the image signal of the recording head surface to the display 60 for displaying the pole-tip assembly to the system user.

The pattern recognition element 54 analyzes the image signal stored in the recognition element computer memory. In one embodiment of the invention, the pattern recognition element 54 employs as edge detection technique to identify portions of the image signal representative of the edges of the footprint of the pole-tip assembly. The edge signal provides precision information as to the location of the pole-tip assembly relative to a known registration point of the system 10. Accordingly, the system 10 can employ the detected edge to define precisely the location of the pole-tip assembly that is to be processed.

In a further embodiment, the pattern recognition element 54 identifies each edge of the footprint of the pole-tip assembly. The recognition element processes these detected edges to extract feature information from the image signal. The features typically represent geometric patterns, such as squares, curves or other geometric shapes that represent an outline of a portion of the pole-tip assembly. The geometric signals that are formed from the edge signals provide precise coordinate information as to the location of the features of the pole-tip assembly. The feature extraction element of the pattern recognition element 54 can be a signal processing program stored in a program memory of the pattern recognition element 54 and implemented by the pattern recognition processor element. The feature extraction code analyzes the location information of each detected edge to identify sets of matched coordinates between different detected edges. A matched set of coordinates identifies an intersection between two edges. The feature extraction element employs the edges and intersection points to identify the geometric pattern formed by the detected edges. The geometric patterns outline the poles of the pole-tip assembly.

As depicted in FIG. 1, the pattern recognition system 54 connects via a transmission path to the processor element 52 and includes an interface for transmitting to the processor element 52 the geometric pattern information. It will be apparent to one of ordinary skill in the art of electrical engineering that information signals can be represented as electronic digital data signals suitable for transmission across electrical transmission lines.

In one embodiment, the processor 52 includes a trim outline element that employs the geometric pattern information of the pole-tip assembly to generate a geometric pattern that represents a selected portion of the recording head that is to be milled. The processor 52 generates from this trim outline a series of milling instructions that are transmitted via transmission path 66 to the control element 58 of the ion column 12. The milling instructions can comprise deflection signals that cause the deflection elements 19 to scan across the surface of the recording head 30 according to the geometric pattern determined by the processor 52. In this way, the processor 52 generates milling instructions that direct the ion beam 20 to etch away a selected portion of the recording head 30.

In one embodiment, the processor element 52 will find features that may vary in size and position. The processor element 52 can apply a predefined milling template relative to the actual features found. The relative placement and size compensation is accomplished by pinning edges of the template to edges of the model that the pattern recognition is searching for. Model matching is well known in the art of pattern recognition.

The processor 52 pinning operation can be understood as a logical attachment of a mill site geometry edge (in an image) to a model edge. Models can be stored as data in a processor data memory. This attachment will allow the mill site to follow the given feature within the image area. Pins can also cause the mill site geometry to "shrink wrap" around the detected feature. This effect coupled with the ability to apply pin bias will allow the same pattern to be milled from varying feature sizes. A constraint will force one or two trim sites to have an explicit dimension. If a specific dimension is required for milling, which is often the case, a constraint may be applied to ensure that as a result of pinning the required dimensions remain intact. Accordingly, the pattern can adapt to produce the correct machined read/write head.

As will be seen from the above description, the system 10 depicted in FIG. 1 provides a system for manufacturing thin-film magnetic read/write heads that automatically identifies the location and geometry of a pole-tip assembly and, generates from the location and geometric information a set of milling signals that direct the focused particle beam to mill the recording head and thereby form a pole-tip assembly that has the precise geometry suitable for generating the selected magnetic field pattern. One such operation is illustrated in FIGS. 4*a,* 4*b,* and 4*c.*

Figure 4A:
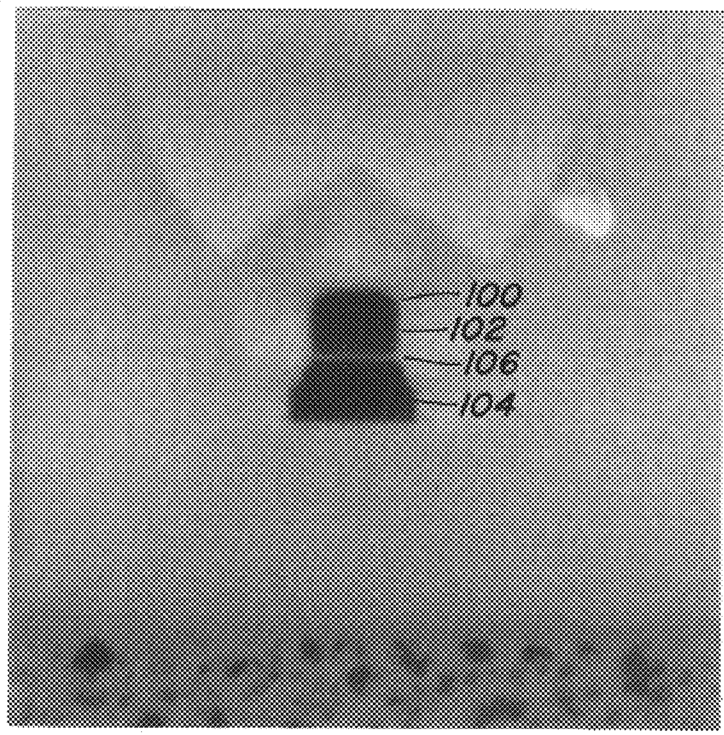
FIG. 4 depicts the operation of a pattern-recognition element and a processor element of the system depicted in FIG. 1.

FIGS. 4*a,* 4*b,* and 4*c,* depict a sequence of process steps for generating milling signals for processing the pole-tip assembly of a recording head. FIG. 4*a* depicts an image signal generated by pattern recognition element 54 causing the ion beam 20 to scan across the surface of the recording head 30. As illustrated by FIG. 4*a* the depicted pole-tip assembly 100 includes a first pole 102, a second pole 104, and a gap 106 disposed between the first and second poles. The depicted pole-tip assembly 100 has a first pole 102 which is generally square in shape and a second pole 104 which is generally rectangular having outer portions that extend further than the outer portions of pole 102. Accordingly, the image signal collected by the pattern recognition element 54 of the pole-tip assembly 100 provides information as to the presentation of pole-tip assembly 100 to the particle beam processing system 10. Presentation of the pole-tip assembly 100 provides a system 10 with the information as to the location and orientation of each pole 102 and 104 of the pole-tip assembly 100. Moreover, the image of the pole-tip assembly presentation provides the system with information as to the particular manufacturing defects which occur during the manufacture of the read/write head. In the embodiment depicted in FIG. 4*a,* the presentation of the pole-tip assembly 100 provides detailed information as to the disparate sizes of the two poles 102 and 104.

Figure 4B:
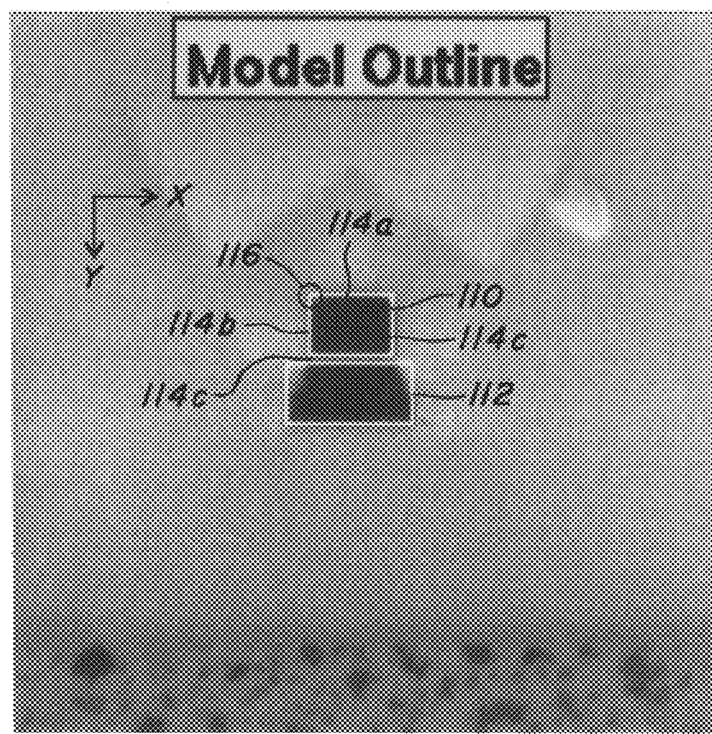

The image signal of the pole-tip assembly 100 is processed by the pattern recognition element as depicted in FIG. 4*a*. FIG. 4*b* illustrates the pole-tip assembly 100 having superimposed above the image of the pole-tip assembly 100 a first rectangular outline 110, and a second rectangular outline 112. As further depicted by FIG. 4*b* the first rectangular outline 110 comprises four edges depicted as 14*a,* 14*b,* 14*c,* and 14*d.* The edges 14*a* and 14*b* come together at an intersection that forms a corner 116. For purposes of clarity, only the edges of the rectangular outline 110 are described and only one corner 116 is described. However, it will be apparent to one of ordinary skill in the art of pattern recognition that the construction of the rectangular outline 112 follows from similar techniques as described with respect to the rectangular outline 110. As described above, the pattern recognition element 54 identifies for the pole 110 a set of four edges 114*a,* 114*b,* 114*c,* and 114*d* that generally describe the footprint of the pole 110.

The feature extraction program determines the intersections between edges, such as the intersection 116 between edges 114*a* and 114*b* which forms the upper left-hand corner of the rectangle 110. From the edge signals and from the intersections the feature extraction code determines a geometric pattern that suitably represents the footprint of the pole 100. In one embodiment of the invention, the precise location of the pole-tip assembly is determined by generating an image of the recording head that is sufficiently large to include an image of a registration post that is disposed proximate to the recording head. As is known in the art, a registration post can have a precisely defined location. The pattern recognition element 54 employs the known position of the registration post to determine a set of offset coordinates that represent the position of the pole-tip assembly relative to the registration post.

In the depicted embodiment, the registration post is disposed sufficiently far from the pole-tip assembly of the recording head that a first image is taken with sufficiently low magnification as to generate an image that encompasses both the registration post and the pole-tip assembly of the read/write head. In a subsequent step, the pattern recognition element 54 generates a second image that represents, at a higher magnification, the pole-tip assembly 100 of the read/write head. At this high magnification, the registration post does not appear within the borders of the image.

Figure 4C:
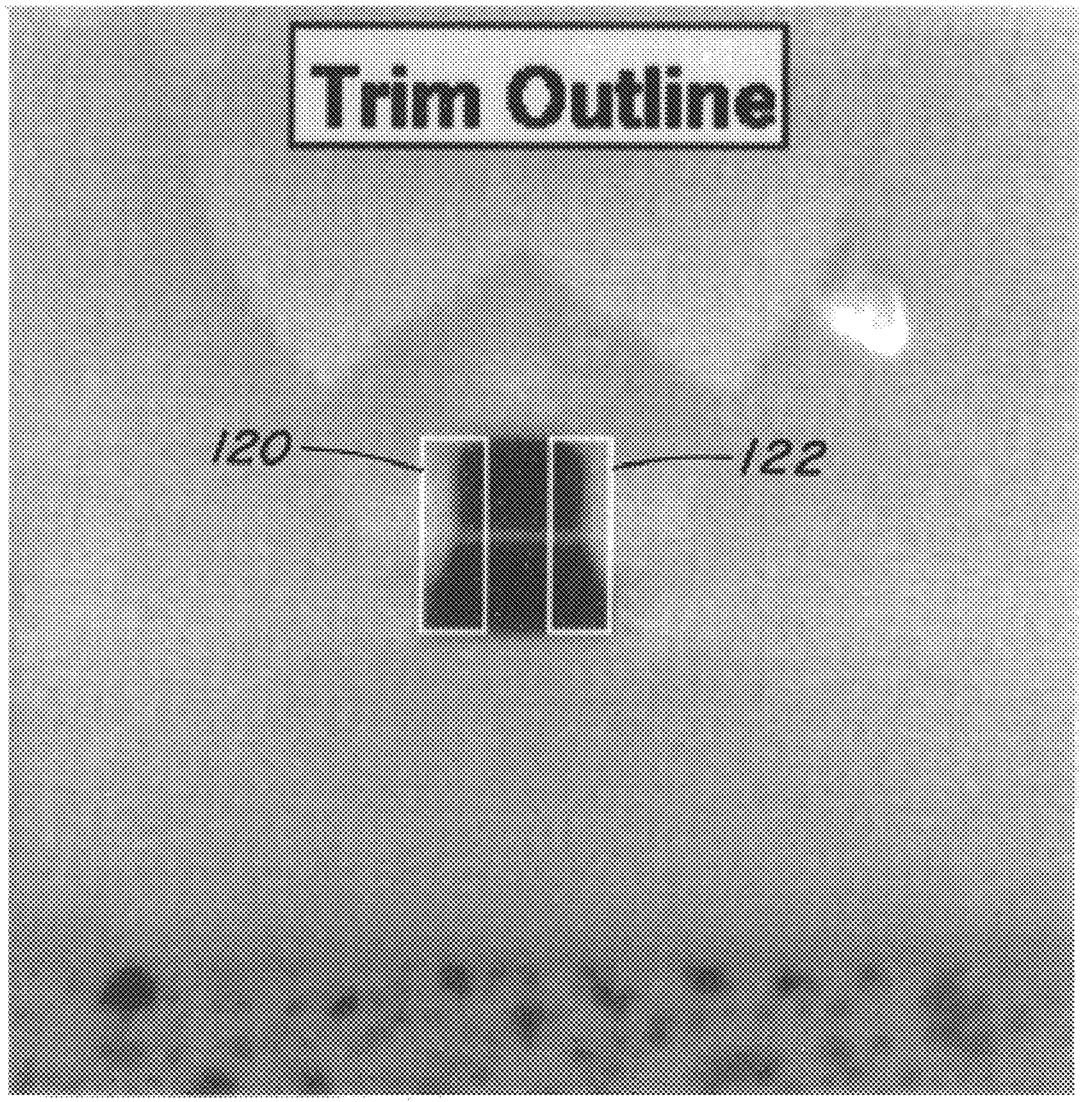

The pattern recognition element 54 passes the geometric pattern information depicted in FIG. 4*b* to the processor element 52. The processor element 52 generates a trim outline signal, depicted in FIG. 4*c,* that includes a first trim outline 120 and a second trim outline 122, each of which represents geometric patterns superimposed over the image of the pole-tip assembly 100. Each trim outline 120 and 122 further represents a selected portion of the recording head to be removed by the ion milling process. In the depicted embodiment, the trim outlines 120 and 122 of FIG. 4*c,* identify two etching areas that will selectively move portions of the recording head and the pole-tip assembly to provide a pole-tip assembly 100 that has equally-sized surfaces for both poles 102 and 104.

Figure 5:
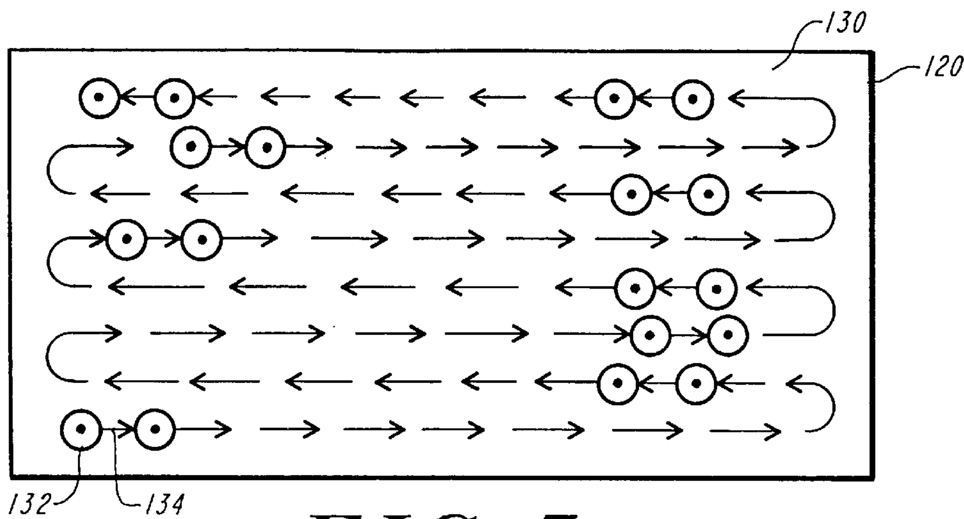
FIG. 5 depicts a digital raster milling process suitable for practice by the system depicted in FIG. 1.

The processor 52 generates from the trim outline signals 120 and 122 a set of milling instructions for directing the particle beam 20 to mill the surface of the recording head 30. In one embodiment, the processor 52 generates a series of milling instructions for operating the ion column 12 to implement a digital raster pattern as depicted in FIG. 5. FIG. 5 illustrates a digital raster pattern 130 that comprises a series of pixel locations 132, each corresponding to the spot size of the ion beam 20, and separated by a pitch 134 which in the depicted digital raster pattern 130 is similarly sized to the beam spot size, and preferably small enough to allow for overlap during the milling process. One such beam spot size is approximately 0.7 microns. As depicted in FIG. 5, the processor element 52 therefore generates from the trim outline 120 a set of milling instructions which represent the X and Y locations for directing the particle beam 20 to mill the surface of the recording head 30 and remove the portion of the recording head outlined by the trim outline signal 120.

As described above, in a preferred embodiment of the invention, the processor element 52 includes a scanning generating element that can set for each pixel location 132 a dwell-time signal that represents the amount of time for maintaining the particle beam 20 at the location 132. In this way, the milling signals generated by the processor 52 represent both X, Y and Z parameters for removing material from the recording head 30. Alternatively, the processor 52 can generate a series of milling instructions representative of an analog raster pattern that is a continuous sweep of the focused particle beam across surface area defined by the trim outline signal 120. In such an embodiment, the depth to which the particle beam mills the surface had can be regulated by controlling the number of times the particle beam sweeps across a selected area of the recording head surface 30. Other techniques for controlling the dose delivered to the recording head 30 can be practiced by the present invention for controlling the depth to which material is removed, without departing from the scope thereof.

Figure 6:
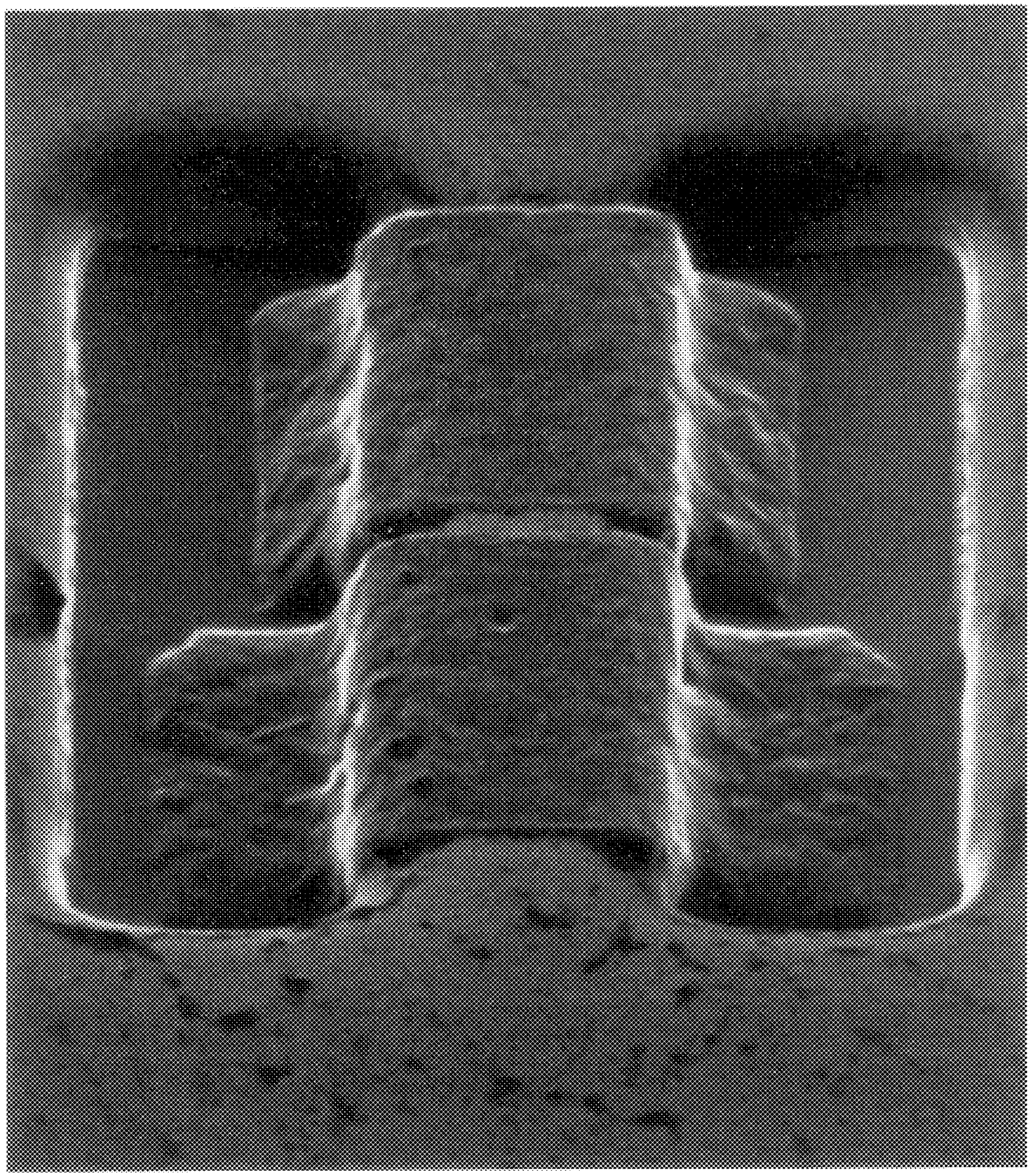
FIG. 6 depicts a pole-tip assembly manufactured according to the invention.

FIG. 6 depicts one recording head pole-tip assembly 140 that has been milled by a system according to the invention to selectively remove portions of the recording head surface. As depicted by FIG. 6, the focused particle beam has removed two rectangular portions from either side of the pole-tip assembly to alter the original geometry of the pole-tip assembly so that each surface of the two poles is substantially of the same size. Each milled portion depicted in FIG. 6 corresponds to the depicted trim outlines 120 and 122 depicted in FIG. 4. In the embodiment illustrated in FIG. 6 the milling signals generated by the processor 52 direct the particle beam 20 to mill to substantially the same depth over the entire portion of the trim outline. Accordingly, the pole-tip assembly 140 includes two poles each having an upper surface and a recessed lower surface spaced away from the upper surface by the distance etched by the focused particle beam and formed from the excess material not removed during the milling process.

Figure 7:
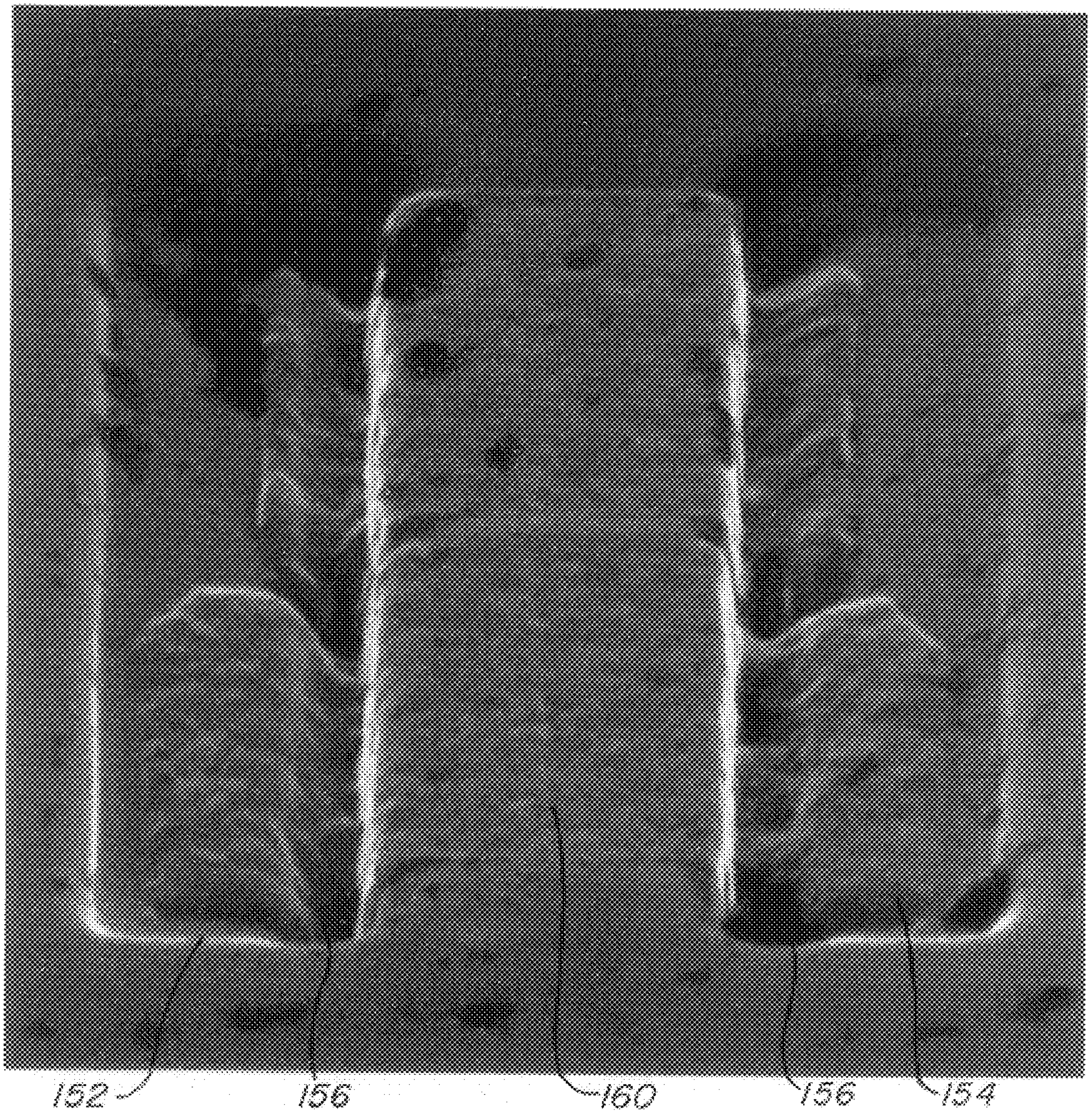
FIG. 7 depicts an alternative pole-tip assembly manufactured according to the invention and having a contoured surface.

FIG. 7 depicts an alternative embodiment of the pole-tip assembly 140. As depicted in FIG. 7 the system according to the invention has etched a portion from each side of the pole-tip assembly to provide two poles each having upper surfaces that are of substantially the same size. As further depicted in FIG. 7, each portion removed from the pole-tip assembly corresponds to one of the trim outlines 120 or 122 depicted in FIG. 4. FIG. 7 further depicts a milling process that employs the scan generator element 62 depicted in FIG. 1.

Specifically, as depicted by FIG. 7, the pole-tip assembly includes two poles, each having a first upper surface and each having a second recessed surface and further having a troth milled between the upper surface and recessed surface. The pole-tip assembly 150 depicted in FIG. 7 includes troughs 156 each disposed on opposing sides of the pole-tip assembly 150 and each disposed between the upper surface 160 and the recessed surfaces 152 and 154. The processor element 52 directs the particle beam 20 to form troughs 156 by directing the particle beam 20 to provide a larger dose at the location of the recording head 30 where troughs 156 are formed. As described above, the scan generator element can include a dose control element such as a scan generator board having the dwell registers, to control selectively the milling depth of the etching process. Accordingly, the system according to the invention can provide recording heads having pole-tip assemblies, such as pole-tip assemblies 150, which include contoured surfaces. These contoured surfaces can have continuous slopes to provide sloped surfaces that extend between an upper surface and a recessed surface. By controlling the formation of recessed slopes, the system according to the invention provides recording heads that have selected magnetic field pattern characteristics including a selected directional characteristic or pulse width characteristic.

Figure 8:
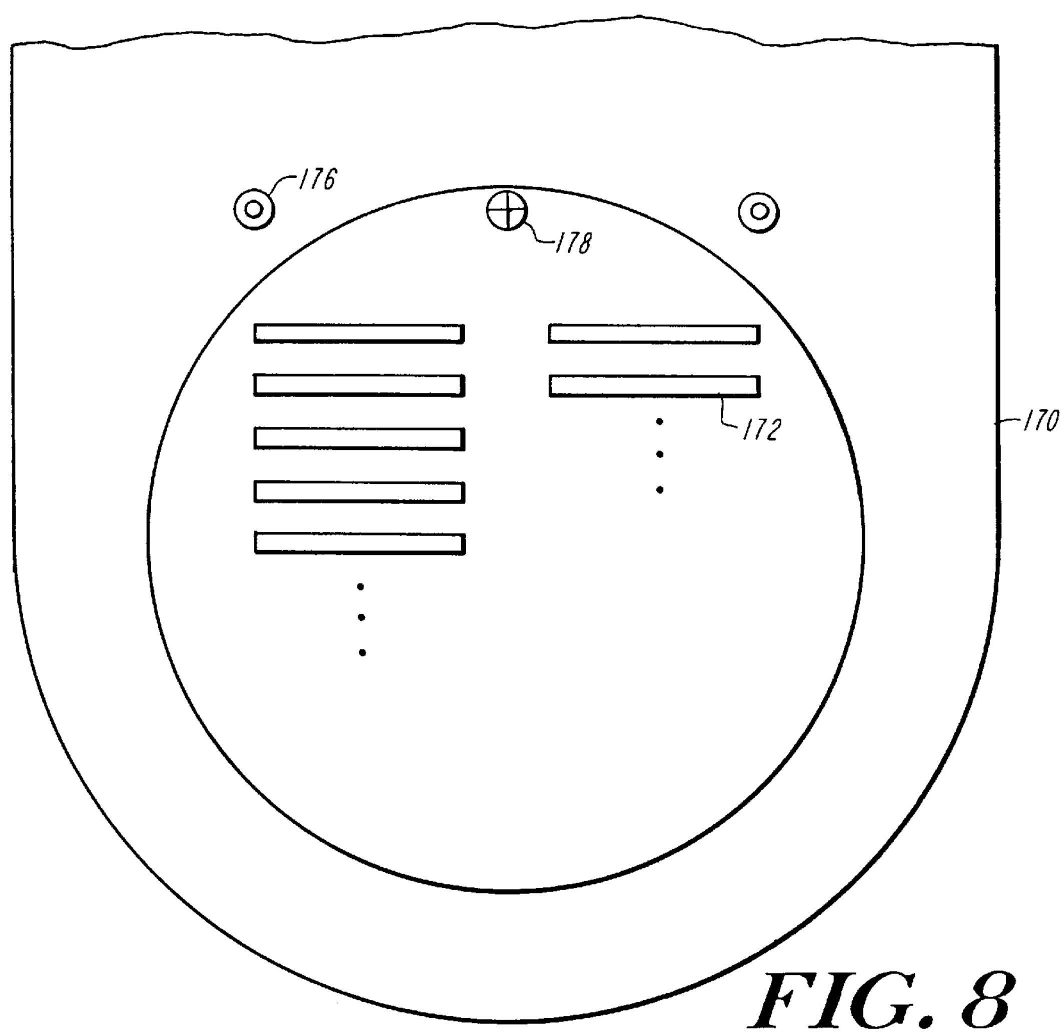
FIG. 8 depicts a delivery tray for delivering plural read/write heads into the system depicted in FIG. 1.

FIG. 8 depicts a delivery tray 170 suitable for practice with the present invention that provides plural recording heads to be processed by the system 10. Further, the delivery tray 170 includes registration posts 174, 176, and 178 that can be employed by the pattern recognition element 54 for determining the precise coordinates of the pole-tip assemblies on the recording heads 172. Accordingly, systems according to the invention provide precision milling of pole-tip assemblies for plural recording heads. Accordingly, systems according to the invention are suitable for high volume manufacturing of thin-film magnetic read/write heads having pole-tip assemblies with precise features.

Figure 9:
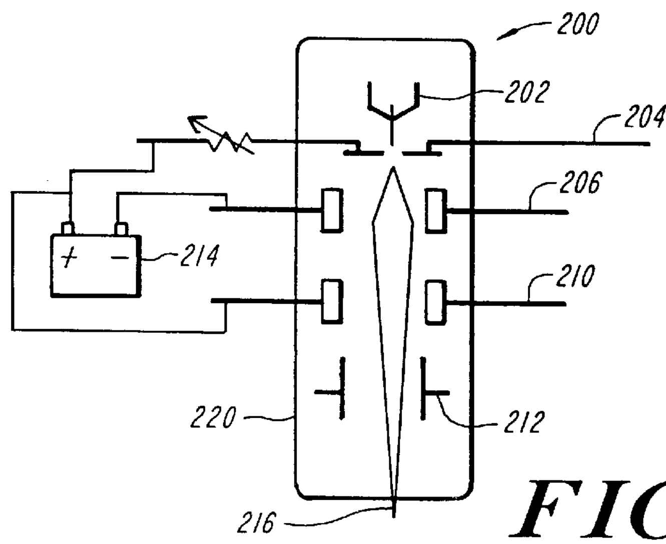
FIG. 9 depicts an ion column suitable for use with the system depicted in FIG. 1.

FIG. 9 depicts a preferred ion column 200 for practice with the invention. FIG. 9 depicts the ion column 200 having an ion source 202, an extraction electrode 204, a lens 206, a second lens 210, deflecting (octopole) elements 212 configured for pre-lens deflection, a power supply 214, focused ion beam 216, a column shield 218 and a housing 220.

The ion column 200 depicted in FIG. 9 is specifically adapted to reduce the beam tail that occurs during the ion milling process. As is known in the art, the beam tail effect is essentially an undesired spreading of the focused ion beam creating a penumbra of sparse ion particles that surround the core beam of particles. This penumbra is generally referred to in the art as the beam tail. The beam tail effect was first observed in electron beam processes and is described in the art in the article Rempfer et al., *Journal of Applied Physics,* Vol. 63(7), p. 2187 (1988). As described therein the beam tail effect arises due to spherical aberrations in the ion optical lens element, which intensify for high current beams.

The ion column 200 depicted in FIG. 9 is a multi-purpose ion column that generates high and low energy ion beams including a high energy, 50,000 kV, ion beam having a reduced beam tail. The column 200 provides an ion source 202 that is located in close proximity to the extraction electrode 204 to bring the source 202 as close as possible to the first lens element 206. In one embodiment of the invention the source 202 is brought within 15 millimeters of the first lens 206. Experimentation indicates that closer proximity to the first lens 206 could provide greater reduction in beam tail, however, the disposition of the extraction electrode, or other mechanical elements between the source 202 and first lens 206 can interfere with the placement of the source 202 relative to the first lens 206.

As further depicted in FIG. 9, the column 200 is a two-lens column having a first lens 206 and a second lens 210. As further depicted in FIG. 9 the first lens 206 is provided with a negative bias relative to the extraction electrode 204. The second lens 210 is provided with a positive bias relative to ground and still negatively biased relative to the extraction electrode 204. In the depicted embodiment, the negative bias applied to the first lens element 206 further reduces the spherical aberration of the ion optical lens assembly. Experimentation has indicated that either of the upper or lower lens 206 or 210 can receive a negative bias relative to the extraction electrode 204. However, in the preferred embodiment of the invention, the first lens 206 receives the negative bias.

The ion column 200 depicted in FIG. 9 is increased in length approximately 4 inches from a conventional ion beam column. The depicted FIG. 9 has an overall length measured from the top of the column housing 220 to the bottom the column shield 218 of approximately 20 inches. The increased length of the ion column 200 provides improved magnification over the range of operation of the multi-purpose ion column.

Experiments showed that ion beam 216 had a reduced beam tail over conventional ion beams operating at substantially the same energy levels. In one test, the ion column 200 depicted in FIG. 9 was operated in an unblanked mode for approximately 5 seconds and directed onto the surface of a test substrate formed of silicon material. After 5 seconds the ion beam 216 was removed from the test substrate and the test substrate was examined. The substrate revealed a generally circular milled portion having a 1 to 2 micron central mill and virtually no beam tail milling that would appear as the removal of material about the periphery of the central milling spot. These test results indicate that the ion column 200 provides an ion beam 216 having a beam tail that is almost completely eliminated.

Figure 10:
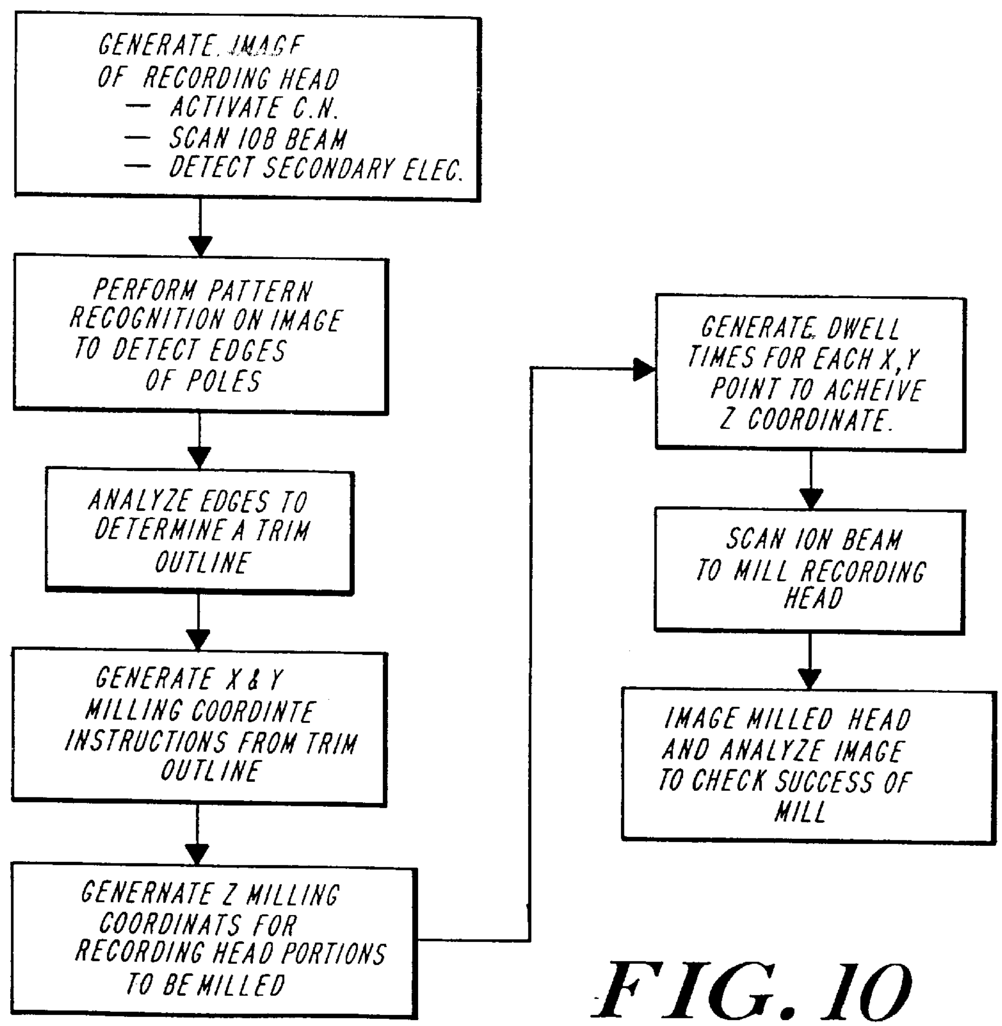
FIG. 10 is a flow chart illustration of one process according to the invention for manufacturing read/write heads.

FIG. 10 depicts one process 300 according to the invention for employing a focused particle beam to shape a pole-tip assembly of a recording head and comprises the step 310 of generating an image signal of the recording head and preferably providing a charge neutralization element for neutralizing a static electric charge that can occur on the recording head, step 320 performing pattern recognition on the image signal, step 330 of analyzing the edges of the pole-tip to determine a trim outline, step 340 of generating X, and Y milling signals representative of an instruction for applying the focused particle beam to a selected portion of the recording head, step 350 of generating Z milling signals representative of an instruction for applying the focused particle beam to a selected portion of the recording head for shaping the pole-tip assembly by milling the selected portion of the recording head to a selected depth, step 360 generating a dwell time for each X, Y point and to achieve the Z coordinate depth, step 370 of scanning the ion beam to mill the recording head, and step 380 of imaging the milled head to check for a successful milling operation.

In step 380, the processor element 52 includes a quality control element that includes a database memory for storing pole-tip feature parameter data that describes acceptable parameters for a milled pole-tip assembly, or recording head. The processor employs the image of the milled head, and can operate the pattern recognition element to determine the geometric features of the milled head, to determine if the head was successfully milled. If the milling operation was successful, the system generates a mill-successful signal, and the next head is milled. Alternatively, the processor 52 determines if a new set of milling signals can be generated to complete the etching of the pole-tip assembly.

In a further embodiment, the process can be adaptable for achieving the etching process as efficiently as possible. In one embodiment, the step of determining an etching pattern signal includes the step of determining a minimum etching time signal that represents a milling pattern having a minimum length of time for conforming the recording head substantially to the select recording head topography. Similarly, the step of determining an etching pattern signal can include the step of determining a minimum etching area signal that is representative of a milling pattern having a minimum area to be removed for conforming the recording head substantially to the select recording head topography. In this embodiment, the process preferably includes a further step of generating milling signals by comparing the presentation signal to plural ones of the pattern signals and for selecting one of the pattern signals as a function of the comparison.

Accordingly, a process of the invention can generate an image of the presentation of the pole-tip assembly and analyze that image by comparing the presentation of the pole-tip assembly to a number of known pattern signals and for selecting a substantially optimum pattern signal for etching the pole-tip assembly. Further, the process can include a step of comparing the presentation of the imaged pole-tip assembly to plural ones of stored modeled presentation signals, each of which represents a possible presentation of a pole-tip assembly, and for determining which of the modeled presentation signals most resembles the imaged presentation signal and to determine from this comparison a pattern signal for milling the pole-tip assembly.

As can be seen from the above description, the systems and methods according to the invention provide improved systems and methods for forming thin film recording heads, and provide recording heads having contoured surfaces. It will be appreciated by those skilled in the art of thin film recording manufacturing techniques that changes can be made to the embodiments and processes described above without departing from the broad inventive concept thereof. It will further be understood therefore, that the invention is not to be limited to the particular embodiments disclosed herein but is intended to cover modifications within the spirit and scope of the present invention as defined by the appended claims.

We claim:

1. Apparatus for shaping a pole-tip assembly of a recording head with a focused particle beam, said apparatus comprising a platform for receiving said recording head having said pole-tip assembly and for disposing said recording head for contact with said focused particle beam;

pattern recognition means for generating an image signal of said recording head pole-tip assembly, for analyzing said image signal and for generating, responsive to said analysis of said image signal, a coordinate signal representative of a position of said recording head pole-tip assembly relative to said focused particle beam; and processor means responsive to said coordinate signal for generating a milling signal representative of an instruction for applying said focused particle beam to a selected portion of said recording head for shaping said pole-tip assembly by milling said selected portion of said recording head.

2. Apparatus according to claim 1 wherein said pattern recognition means for generating an image signal includes a source of a focused particle beam.

3. Apparatus according to claim 1 wherein said pattern recognition means for generating an image signal includes a camera element.

4. Apparatus according to claim 1 further including charge neutralization means for neutralizing a static electric charge on said recording head.

5. Apparatus according to claim 4 wherein said charge neutralization means includes an electron gun element for providing a beam of electrons directed toward said recording head.

6. Apparatus according to claim 1 wherein said pattern recognition means for generating an image signal includes edge detection means for generating an edge signal representative of a location of an edge of said pole-tip assembly.

7. Apparatus for shaping a pole-tip assembly of a recording head with a focused particle beam, said apparatus comprising a platform for receiving said recording head having said pole-tip assembly and for disposing said recording head for contact with said focused particle beam, pattern recognition means for generating an image signal of said recording head pole-tip assembly, for analyzing said image signal, and for generating, responsive to said analysis of said image signal, a coordinate signal representative of a position of said recording head pole-tip assembly relative to said focused particle beam, said pattern recognition means including feature extraction means for determining a geometric pattern signal representative of an outline of a portion of said pole-tip assembly, and means for generating said coordinate signal as a function of said geometric pattern signal, and processor means responsive to said coordinate signal for generating a milling signal representative of an instruction for applying said focused particle beam to a selected portion of said recording head for shaping said pole-tip assembly by milling said selected portion of said recording head.

8. Apparatus for shaping a pole-tip assembly of a recording head with a focused particle beam, said apparatus comprising a platform for receiving said recording head having said pole-tip assembly and for disposing said recording head for contact with said focused particle beam, pattern recognition means for generating an image signal of said recording head pole-tip assembly, for analyzing said image signal, and for generating, responsive to said analysis of said image signal, a coordinate signal representative of a position of said recording head pole-tip assembly relative to said focused particle beam, and processor means responsive to said coordinate signal for generating a milling signal representative of an instruction for applying said focused particle beam to a selected portion of said recording head for shaping said pole-tip assembly by milling said selected portion of said recording head, said processor means including trim outline means for generating, as function of said coordinate signal, a geometric pattern representative of said selected portion of said recording head to be milled.

9. Apparatus according to claim 8 wherein said trim outline means includes adaptor means for generating said trim outline signal as a function of a process time for milling said recording head.

10. Apparatus according to claim 8 wherein said trim outline means includes adaptor means for generating said trim outline signal as a function an area of said selected portion of said recording head to be milled.

11. Apparatus according to claim 1 wherein said pattern recognition means includes control means for generating an image of said milled recording head and for generating a mill-successful signal as a function of said image.

12. Apparatus according to claim 1 wherein said platform includes delivery tray means for disposing plural recording heads beneath said source of a focused particle beam.

13. Apparatus according to claim 1 wherein said processor means further includes a multi-dimensional milling element for generating milling signals for contouring a surface of said recording head.

14. Apparatus according to claim 13 wherein said multi-dimensional milling element includes dose control means for controlling the energy delivered by said particle beam to a portion of said recording head.

15. Apparatus according to claim 13 wherein said dose control means includes a scan generator element having a dwell control element for generating a dwell time signal representative of a measure of time for said focused particle beam to be directed to said recording head.

16. Apparatus according to claim 13 wherein said dose control means includes pixel dose control means for generating, as a function of said coordinate signal, a pixel signal representative of a measure of time for directing said focused particle beam to a discrete location of said recording head.

17. Apparatus according to claim 1 further including a source of a focused particle beam having focusing means for generating a focused particle beam having a reduced beam tail.

18. Apparatus according to claim 17 wherein said focused particle beam source includes an ion beam source for generating a focused ion beam.

19. Apparatus according to claim 18 wherein said ion beam source includes a first lens coupled to an electrical source for negatively biasing said first lens.

20. Apparatus according to claim 17 wherein said focused particle beam source generates a focused particle beam having a reduced beam tail current.

21. Apparatus according to claim 18 wherein said ion beam source includes a liquid metal ion source.

22. Apparatus according to claim 18 wherein said ion beam source includes a gas field ion source.

* * * * *